United States Patent
Pawletko et al.

[11] Patent Number: 6,141,244
[45] Date of Patent: Oct. 31, 2000

[54] MULTI LEVEL SENSING OF NAND MEMORY CELLS BY EXTERNAL BIAS CURRENT

[75] Inventors: Joseph G. Pawletko, Germantown, Md.; Pau-Ling Chen, Saratoga; Shane Charles Hollmer, San Jose, both of Calif.

[73] Assignee: Advanced Micro Devices, Inc., Sunnyvale, Calif.

[21] Appl. No.: 09/388,696

[22] Filed: Sep. 2, 1999

[51] Int. Cl.[7] ................................................. G11C 16/04
[52] U.S. Cl. .......................... 365/185.03; 365/185.17; 365/185.18; 365/121
[58] Field of Search ..................... 365/185.03, 185.17, 365/185.18, 121

[56] References Cited

U.S. PATENT DOCUMENTS

| | | | |
|---|---|---|---|
| 5,539,690 | 7/1996 | Talreja et al. | 365/185.22 |
| 5,594,691 | 1/1997 | Bashir | 365/189.09 |
| 5,748,546 | 5/1998 | Bauer et al. | 365/210 |
| 5,751,634 | 5/1998 | Itoh et al. | 365/185 |
| 5,973,957 | 10/1999 | Tedrow | 365/185.03 |

*Primary Examiner*—David Nelms
*Assistant Examiner*—Connie C. Yoha
*Attorney, Agent, or Firm*—Skjerven Morrill MacPherson LLP; Edward C. Kwok; Mathew J. Spark

[57] ABSTRACT

A method and circuit for sensing multi states of a NAND memory cell by applying plurality of external sensing bias current at a constant positive gate and bias voltage and detecting a cell current wherein the cell current depends upon the state of the memory cell.

12 Claims, 5 Drawing Sheets

MULTI LEVEL SENSING OF NAND MEMORY CELLS BY EXTERNAL BIAS CURRENT

FIELD OF THE INVENTION

The present invention relates to NAND memory cells used in non-volatile flash memory. More specifically, it relates to sensing multi-levels in a NAND memory cell by varying a sensing current in proportion to the number of sensing levels.

BACKGROUND OF THE INVENTION

A conventional NAND EEPROM (Electrically erasable programmable read only memory) array block is formed by a series of floating gate transistors coupled in series between a select drain transistor and a select source transistor. The select drain transistor is coupled to a data transfer line called bit line (BL) and the select source transistor is coupled to a source line. Each floating gate transistor is a memory cell having a floating gate which is programmed and erased using techniques well known to on skilled in the art. The memory cell transistors are floating gate MOSFETs (Metal Oxide Semiconductor Field Effect Transistors).

Conventionally, prior to programming the floating gate of a memory cell is biased to a negative voltage relative to the substrate by storing electrons into the floating gate. A floating gate of a memory cell is then programmed by turning the select source and drain transistors off to isolate tie series of memory cells, biasing a control gate at the programming voltage, and grounding the body region.

A floating gate of a memory device is erased when the substrate is biased, while the control gate is grounded, thereby driving the electrons from the floating gate back into the substrate.

Each NAND memory cell can be programmed into one of several states which can be designated, for example as follows:

- (0,0) denotes an erased state;
- (0,1) denotes a partially erased state;
- (1,0) denotes a partially programmed state; and
- (1,1) denotes a programmed state.

Currently, several reference voltages (Vref1, Vref2 and Vref3) are applied to NAND memory cells for sensing the state of a memory cell. The reference voltage and the state of the memory cell determine a cell current in a sensing circuit. For example a memory cell is conductive when erased, and hence pulls down the sense node. If the memory cell is programmed then it is not conductive and the sense node is pulled up. The state of the memory cell can be determined by analyzing the results after the plurality of reference voltages are applied. "A Non-Volatile semiconductor memory device for storing multivalue data and readout/write-in method" is disclosed in U.S. Pat. No. 5,751,634. (Itoh). Similar to the method described above, in Itoh, reference voltages are applied at individual memory cells during data writing and data readout time, generating memory cell current in response to the reference voltages. The variation in memory cell currents provides the state of the memory cell. The disadvantage of Itoh is that the sensing circuitry mist be reset because the reference voltages are changed at least twice and applied to a high impedance aord line (WL).

Another method to sense the state of a NAND memory cell is by applying an external bias current at 0v on the WL and evaluating a sense node voltage generated in response to the external bias current. The disadvantage of such a method is that only two states (0,0) and (1,1) can be sensed.

Therefore, what is desired is a circuit and a method that efficiently senses the levels of a multi state NAND memory cell without causing significant disturbance to memory cells adjacent to the memory cell sensed at any given time.

SUMMARY OF THE INVENTION

A method and circuit for sensing the state of a NAND memory cell in a NAND string connected to a bit line by applying several sensing bias currents sequentially ("external bias current") to the bit line at fixed positive gate and bias voltages; and detecting a cell current. The cell current results from and corresponds to the state of the NAND cell, which depends upon both the cell current and the threshold voltage at a fixed gate voltage. The states of the NAND cell are defined as a function of cell current and threshold voltage for a constant gate voltage and bias voltage.

The present invention his the advantage of sensing the states of a NAND memory cell at a fixed bias voltage and hence minimizing any fluctuation that may occur if various reference voltages are applied to the memory cells. Furthermore, the present invention is more accurate than conventional techniques because the cell states are defined as a function of cell current. Also, since the sensing circuitry is not required to be reset the present invention is faster than conventional sensing techniques.

This brief summary has been provided so that the nature of the invention may be understood quickly. A more complete understanding of the invention can be obtained by reference to the following detailed description of the preferred embodiments thereof in connection with the attached drawings.

DETAILED DESCRIPTION OF THE INVENTION

Figure 1:
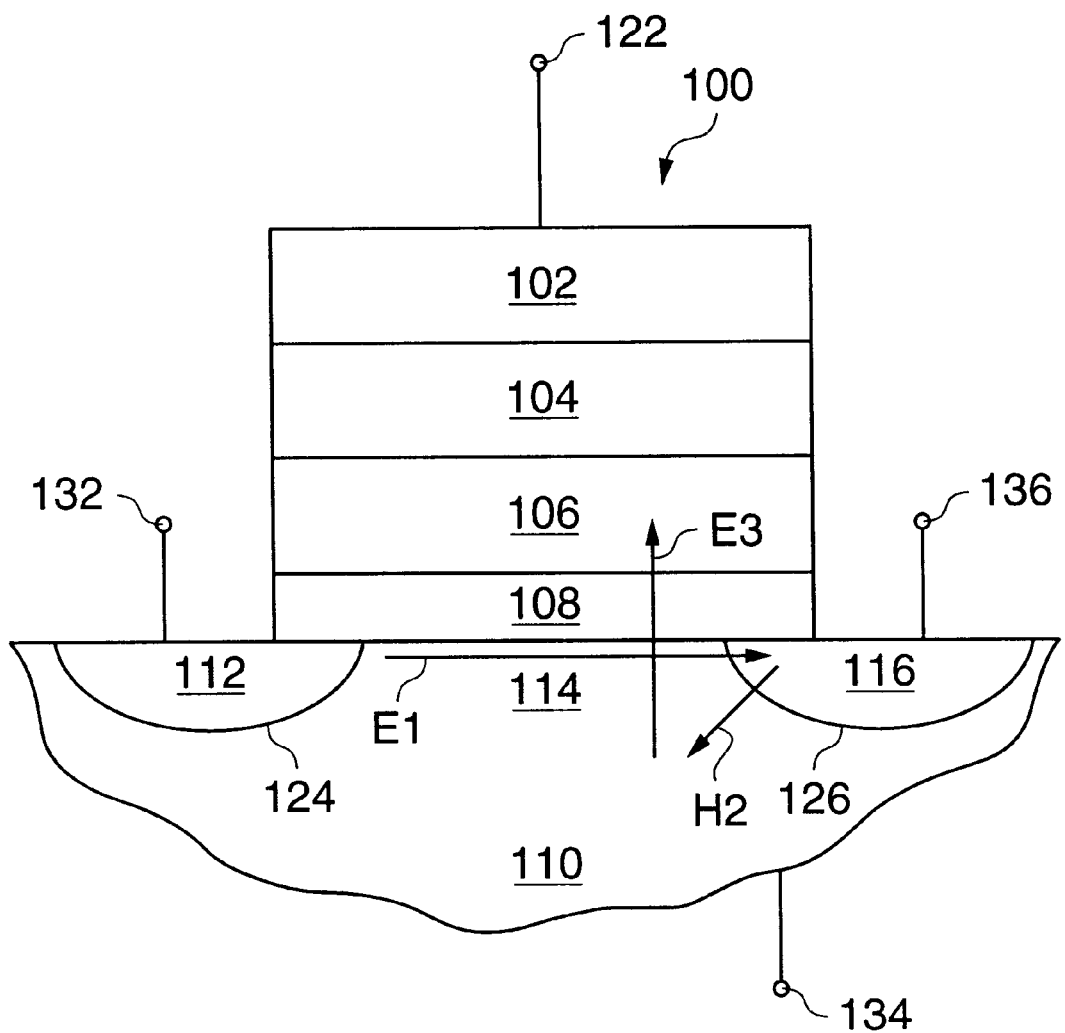
FIG. 1 is a cross sectional diagram of a floating type memory cell.

FIG. 1 is a cross-sectional diagram of a floating gate memory cell 100 of a NAND array block. Memory cell 100 is a floating gate transistor having a control gate 102 coupled to a voltage line 122 for applying a voltage of $V_g$ on control gate 102. Control gate 102 is separated from a floating gate 106 by an upper insulating layer 104, the floating gate 106 being separated from a substrate 110 by a lower insulating layer 108.

Substrate 110 includes an n+ source region 112 coupled to a voltage line 132 for applying a voltage of $V_s$ on n+ source region 112, a p-doped body region 114 coupled to a voltage line 134 for applying a voltage on p-doped body region 114, and an n+ drain region 116 coupled to a voltage line 136 for applying a voltage of $V_D$ on n+ drain region 116.

Figure 2:
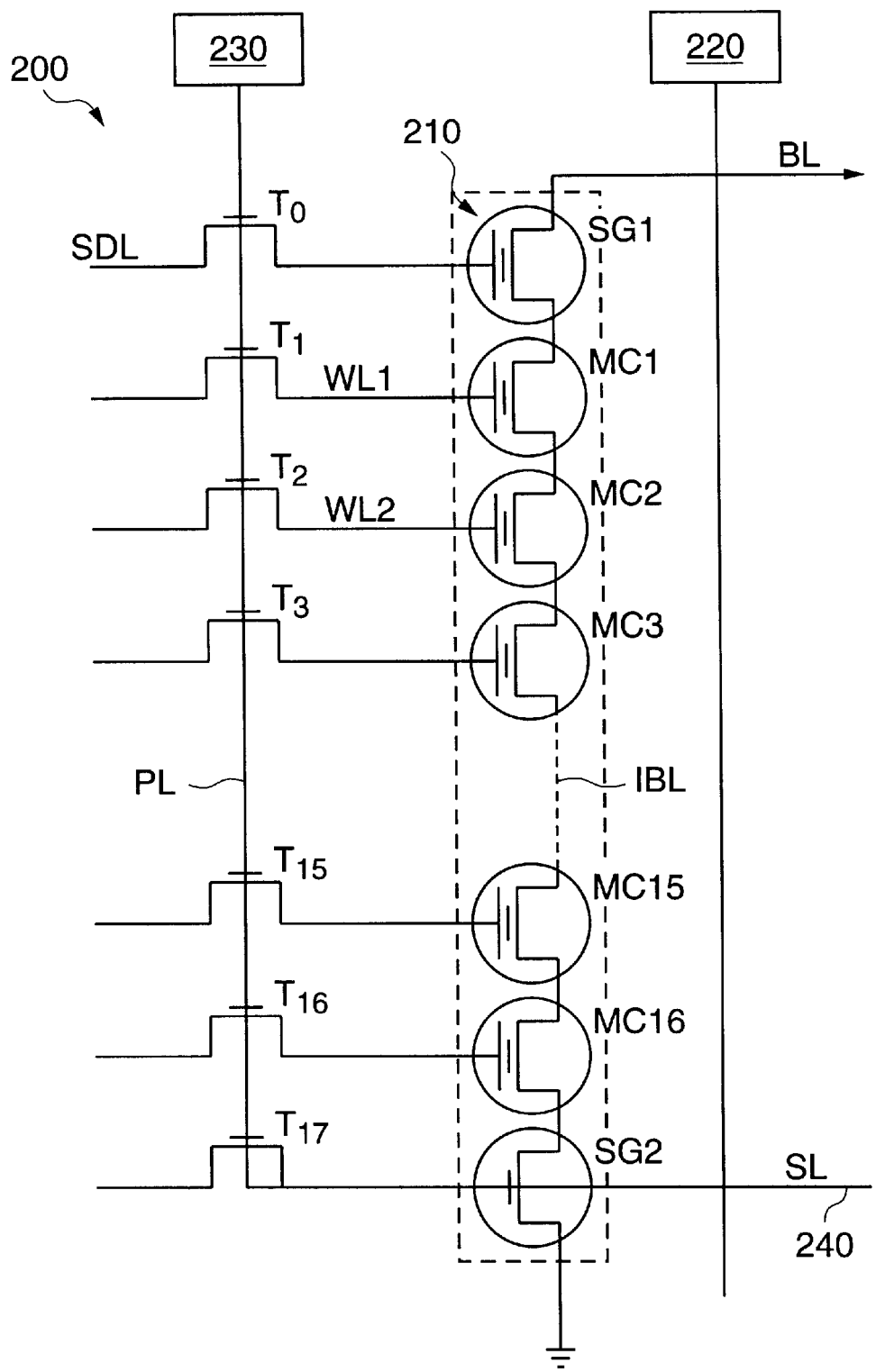
FIG. 2 is a schematic diagram of a NAND array block.

FIG. 2 is a schematic diagram of a conventional NAND array block 200. Block 200 includes an external bit line BL coupled to a sense circuit 220 for determining if the cell current is greater or less than a given sensing bias (external) current on external bit line BL. Select drain transistor SG1 couples bit line BL to string 210 while string 210 includes select drain transistor SG1 and internal bit line IBL coupled in series between external bit line BL and a source line 240.

Internal bit line IBL connects a NAND structure of 16 floating gate memory cells MC1 to MC16 connected in series between select gate transistors SG1 and SG2.(for clarity reasons, only memory cells MC1 to MC3 and MC15 to MC16 are shown in FIG. 2). Other configurations of 4, 8 or 32 memory cells may also be used. Memory cell MC3 can be implemented by memory cell 100 of FIG. 1. One terminal of memory cell MC16 in the string 210 is coupled to select source transistor SG2 that is connected to source line 240.

Each control gate of memory cells MC1 to MC16 is coupled to a pass transistor (i.e. one of transistors T1 to T16) while the control gate of select drain transistor SD is coupled by transistor T0 to select drain line SDL. Each of transistors T0 to T17 is coupled to charge pump 230 by pump line PL for applying voltages on lines SDL and WL1 to WL16 to the respective control gates of select drain transistor SG1 and SG2, and memory cells MC1 to MC16.

Figure 3:
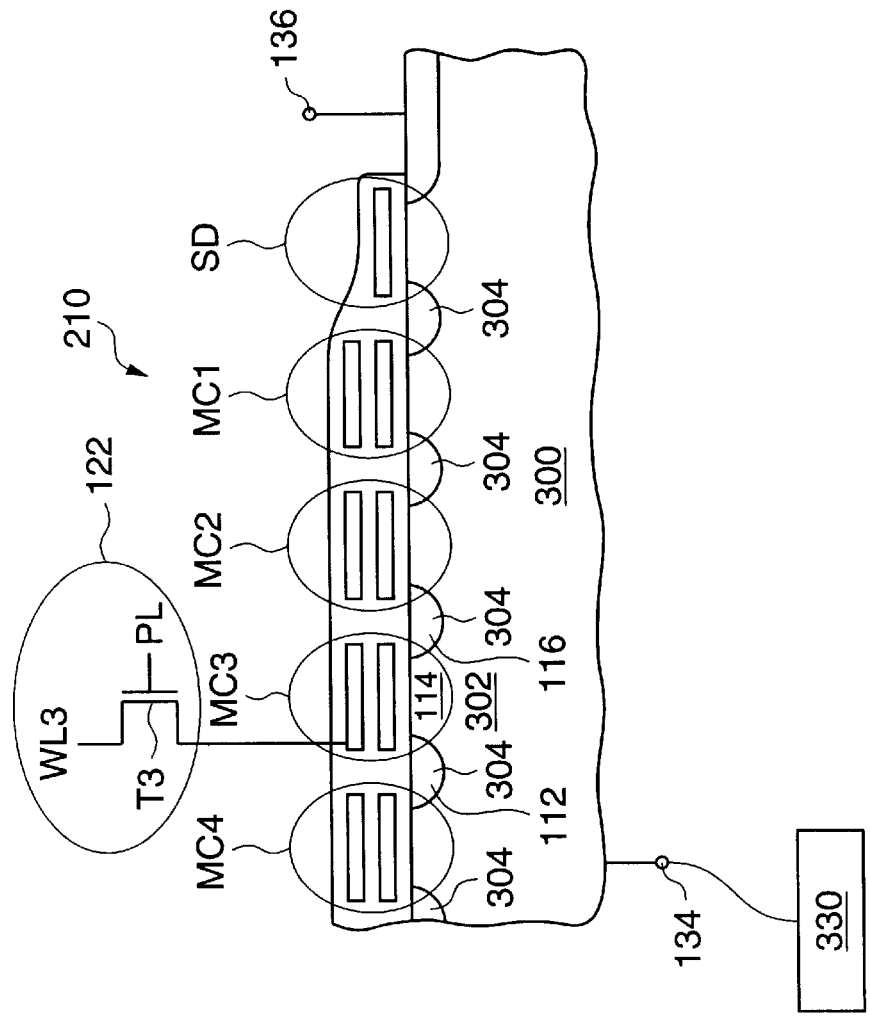
FIG. 3 is a cross sectional diagram of the string of FIG. 2 as disposed on a substrate.
Figure 3:
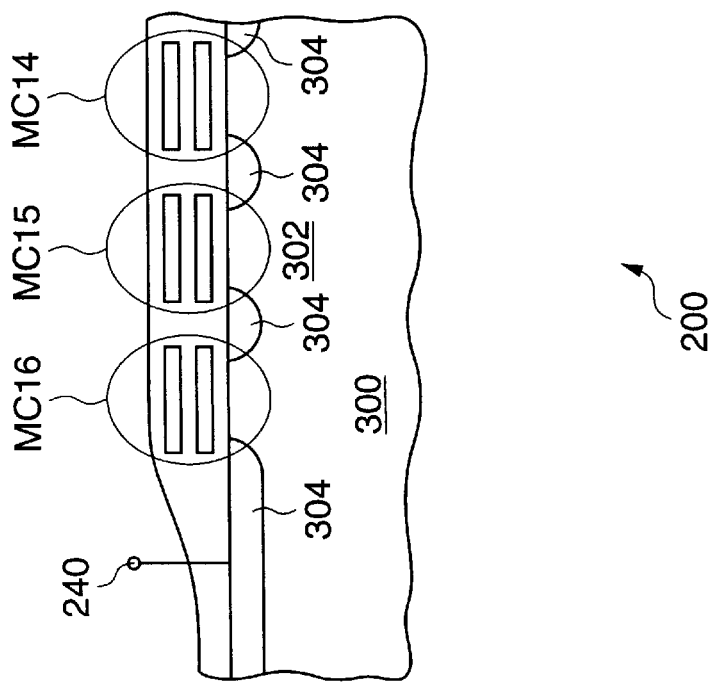

FIG. 3 is a cross sectional diagram of string 200 of FIG. 2 as disposed on a substrate 300. Memory cells MC1 to MC16, of which, for clarity reasons, only memory cells MC1 to MC4 and MC14 to 4C16 are shown in FIG. 3, are fabricated on a substrate 300.

Substrate 300 includes a p-well region 302, which serves as a body region for memory cells MC1 to MC16. P-well region 302 is coupled o voltage line 134 for asserting voltage $V_{pw}$ on p-welL region 302. Substrate 300 also has n+ regions 304, which form the n+ source and drain regions of memory cells MC1 to MC16.

Figure 4:
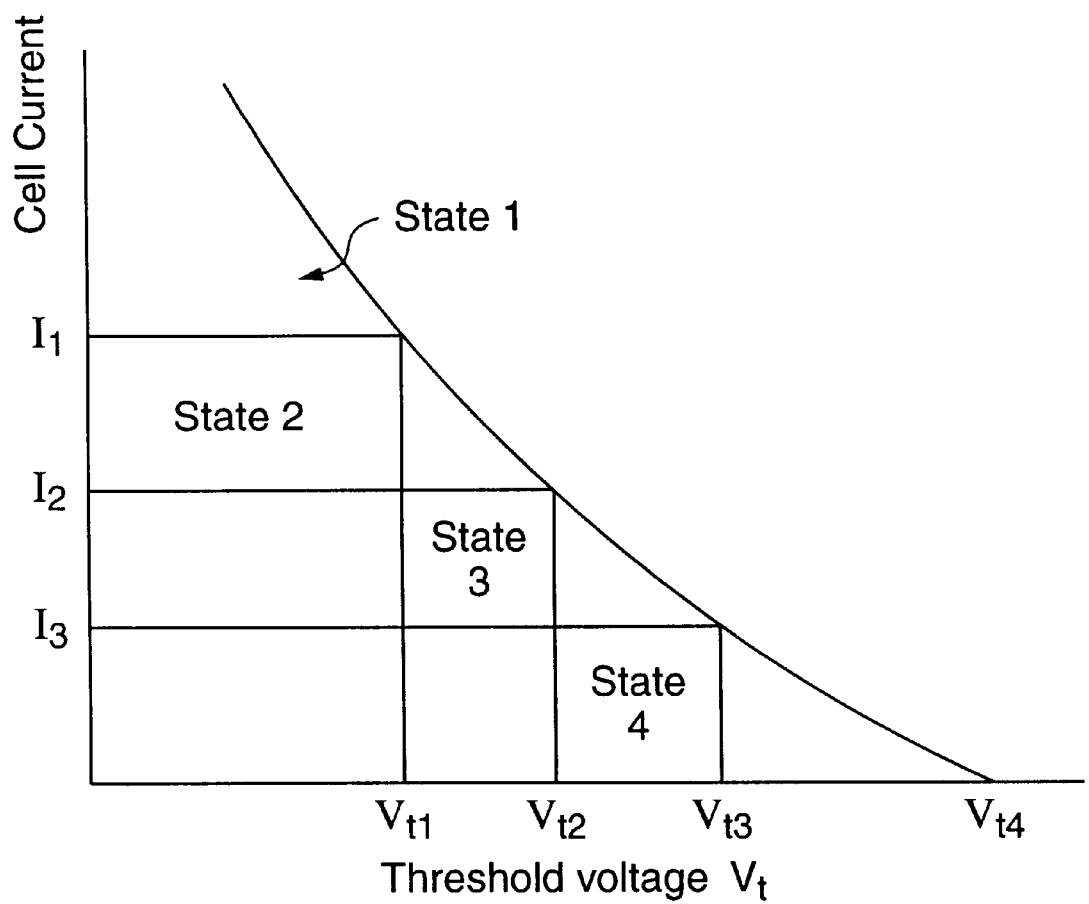
FIG. 4 is a diagram showing four states of a NAND memory cell.

FIG. 4 graphically defines four states of a NAND memory cell according to the present invention. Memory cell current ($I_d$) is plotted against the threshold voltage ($V_t$) for a fixed gate voltage. A particular memory cell state is defined is a function of cell current and threshold voltage. For example as shown in FIG. 4, State 1 is defined by cell current greater than cell current $I_1$ and threshold voltage less than $V_{t1}$ at a fixed gate voltage $V_g$. Similarly, state 2 is defined by a cell current greater than I2 and less than I1 and threshold voltage less than $V_{t1}$. State 3, is defined by a cell current between I2 and I3 and threshold voltage between $V_{t1}$ and $V_{t2}$. State 4, is defined by cell current less than I3 and threshold voltage between $V_{t2}$ and $V_{t3}$.

Figure 5:
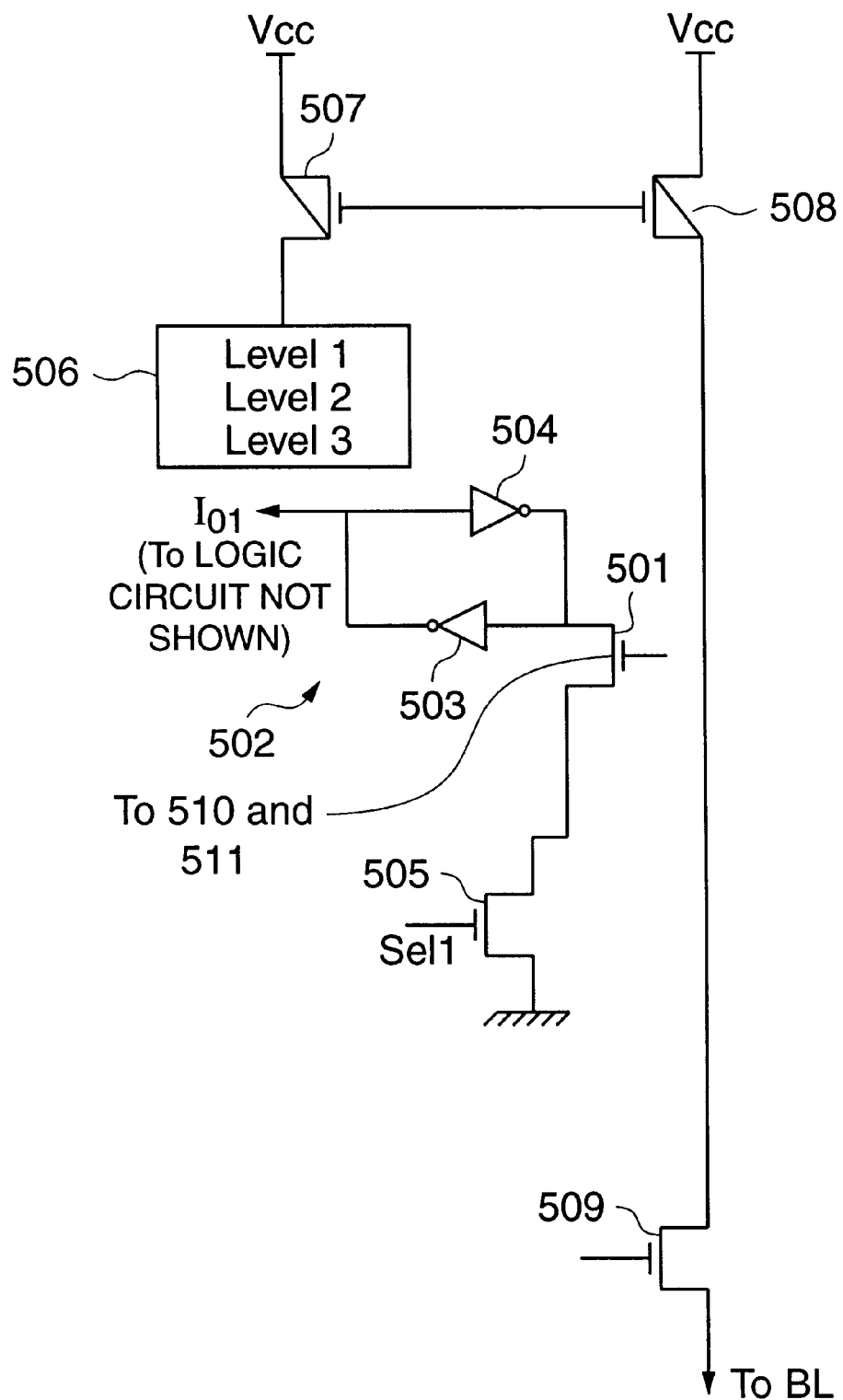
FIG. 5 shows a NAND cell sensing circuit of the present invention.

FIG. 5 is a circuit diagram that senses multi levels of a NAND memory cell according to the present invention. FIG. 5 shows a current source generator 506 for providing a plurality of sensing bias current for sensing the memory cell states. Current source generator 506 generates a certain current that is transferred to BL via current mirror transistors 507 and 508. Also shown in FIG. 5 are a latch circuit 502 with gates 503 and 504 and a cascade bias 509 that limits voltage on BL.

For illustration purposes, memory cell MC3 is sensed. Sensing bias currents $I_{b1}$, $I_{b2}$ and $I_{b3}$ are applied along external bit line BL in a pre-defined sequence. A fixed positive gate voltage $V_g$ is applied to memory cell MC3 at instant t. Memory cell MC3 generates a cell current corresponding to the memory cell state. The cell current is compared to the applied sensing bias current and the corresponding cell state is determined.

External bias current $I_{b1}$ is applied to BL at constant cell gate voltage Vg and external bias voltage. Memory cell MC3 generates a cell current corresponding to the memory cell state. If memory cell MC3 current is greater than $I_{b1}$ it pulls sense node 501 down. Consequently, the flip flop latch circuit 502 stays in the same condition (0,1). If memory cell MC3 current is less than $I_{b1}$, then the sense node 501 is pulled up, hence a signal from sense node 501 flips the flip-flop 501 to a 1,0 state. An output signal Io1 from flip-flop 501 is sent to a logic circuit (not shown).

Similarly, external bias currents $I_{b2}$ and $I_{b3}$ are applied to external bit line BL. As shown above based upon memory cell state, signals are sent to latch circuits 510 and 511 (not shown, similar to the latch circuit 502), that generate output signals $I_{o2}$ and $I_{o3}$ (similar to $I_{o1}$) to a logic circuit (not shown). Based upon the output signals from the flip-flop circuits, 502, 510 and 511, memory cell state is determined. The process is repeated at pre-determined intervals.

Although the present invention has been described with reference to specific embodiments, these embodiments are illustrative only and not limiting. Many other applications and Embodiments of the present invention will be apparent in light of this disclosure and the following claims.

What is claimed is:

1. A method for sensing the state of a multi state NAND memory cell in a NAND string connected to an external bit line, comprising the steps of:

generating a plurality of external sensing bias currents using a current generator;

applying plurality of external sensing bias currents to the external bit line at a constant positive gate voltage;

detecting a cell current, wherein the cell current is based upon the state of the NAND memory cell; and determining the state of the NAND memory cell, wherein the state of the NAND memory cell depends upon the cell current and a threshold voltage at a constant positive gate voltage.

2. The method of claim 1 further comprising:

sending an output signal to a latch circuit, wherein the output signal flips the latch circuit.

3. The method of claim 2 wherein the latch circuit includes a flip-flop latch.

4. The method of claim 1, wherein the multi states of the NAND memory cell are based upon the cell current and the threshold voltage for a constant positive gate voltage.

5. The method of claim 1, wherein the plurality of external sensing bias currents are applied at a constant external bias voltage.

6. A circuit for sensing multi states of a NAND memory cell comprising of:

a NAND string of memory cells connected to an external bit line, wherein the memory cells are connected in series and plurality of external sensing bias currents are applied at a constant positive gate voltage;

a sense node for generating a signal biased upon a memory cell current in response to the applied plural external sensing bias current at a constant gate voltage; and a latch circuit to flip from a pre-conditioned state based upon a signal generated in response to the memory cell current.

7. The circuit of claim 6, wherein the multi states of the NAND memory cell are based upon the memory cell current and a threshold voltage for a constant positive gate voltage.

8. The circuit of claim 6, wherein the plurality external sensing bias currents are applied at a constant external bias voltage.

9. A circuit for sensing multi states of a NAND memory cell comprising of:
- a NAND string of memory cells connected to an external bit line, wherein the memory cells are connected in series;
- a current generator for generating a plurality of external sensing bias currents wherein the plural external sensing bias currents are applied at a constant positive gate voltage;
- a sense node for generating a signal based upon a memory cell current in response to the applied plural external sensing bias current at a constant gate voltage; and
- a latch circuit to flip from a pre-conditioned state based upon a signal generated in response to the memory cell current.

10. A method for sensing the state of a multi state NAND memory cell in a NAND string connected to an external bit line, comprising the steps of:
- applying a plurality of external sensing bias currents sequentially to the bit line at fixed positive gate and bias voltages; and
- detecting a cell current wherein the cell current results from and corresponds to the state of the NAND cell, which depends upon both the cell current and the threshold voltage at a fixed gate voltage and wherein the states of the NAND cell are defined as a function of cell current and threshold voltage for a constant gate voltage and bias voltage.

11. A circuit for sensing multi states of a NAND memory cell comprising of:
- a NAND string of memory cells connected to an external bit line, wherein the memory cells are connected in series and a plurality of external sensing bias currents are applied sequentially at a constant positive gate voltage;
- a sense node for generating a signal based upon a memory cell current in response to the applied plural external sensing bias current at a constant gate voltage; and
- a latch circuit to flip from a pre-conditioned state based upon a signal generated in response to the memory cell current wherein the multi states of the NAND memory cell are based upon the memory cell current and a threshold voltage for a constant positive gate voltage.

12. The circuit of claim 6, wherein the plurality of external sensing bias currents are applied at a constant external bias voltage.

* * * * *